United States Patent
Ahmed et al.

(10) Patent No.: US 12,009,025 B2
(45) Date of Patent: Jun. 11, 2024

(54) WEAK PRECHARGE BEFORE WRITE DUAL-RAIL SRAM WRITE OPTIMIZATION

(71) Applicant: Advanced Micro Devices, Inc., Santa Clara, CA (US)

(72) Inventors: Tawfik Ahmed, Austin, TX (US); Andrew J. Robison, Ft. Collins, CO (US); Russell J. Schreiber, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/358,527

(22) Filed: Jun. 25, 2021

(65) Prior Publication Data

US 2022/0415386 A1 Dec. 29, 2022

(51) Int. Cl.
*G11C 11/419* (2006.01)
*G11C 11/412* (2006.01)
*G11C 11/418* (2006.01)

(52) U.S. Cl.
CPC .......... *G11C 11/419* (2013.01); *G11C 11/412* (2013.01); *G11C 11/418* (2013.01)

(58) Field of Classification Search
CPC .... G11C 11/418; G11C 11/419; G11C 11/412
USPC ........................................................ 365/156
See application file for complete search history.

(56) References Cited

U.S. PATENT DOCUMENTS

| | | | |
|---|---|---|---|
| 5,752,045 A | 5/1998 | Chen | |
| 5,828,612 A * | 10/1998 | Yu | G11C 11/419 365/207 |
| 9,928,889 B1 * | 3/2018 | Narasimhan | G11C 7/1075 |
| 10,043,572 B1 | 8/2018 | Schreiber et al. | |
| 10,147,483 B1 | 12/2018 | Mohanty et al. | |
| 10,332,570 B1 | 6/2019 | Ahmed | |
| 10,395,700 B1 | 8/2019 | Bringivijayaraghavan et al. | |
| 10,431,269 B2 | 10/2019 | Kumar et al. | |
| 10,438,636 B2 | 10/2019 | Ahmed et al. | |
| 10,541,013 B1 | 1/2020 | Schreiber et al. | |
| 10,790,013 B1 | 9/2020 | Dubey et al. | |
| 10,867,665 B1 | 12/2020 | Dubey et al. | |
| 11,183,234 B2 | 11/2021 | Fujiwara et al. | |
| 11,257,825 B1 | 2/2022 | Xian et al. | |
| 2005/0152199 A1 | 7/2005 | Park | |
| 2005/0265096 A1 | 12/2005 | Obara et al. | |
| 2006/0092711 A1 | 5/2006 | Kant et al. | |
| 2006/0274002 A1 | 12/2006 | Guttag | |

(Continued)

FOREIGN PATENT DOCUMENTS

| | | | |
|---|---|---|---|
| KR | 10-2013-0033230 A | | 4/2013 |
| KR | 10-2016-0042083 A | | 4/2016 |
| WO | 2014105013 A1 | | 7/2014 |

OTHER PUBLICATIONS

Search Report and Written Opinion in PCT/US2022/033402 dated Sep. 28, 2022, 9 pages.

*Primary Examiner* — Sung Il Cho
(74) *Attorney, Agent, or Firm* — Zagorin Cave LLP (57) ABSTRACT

A method for accessing a memory cell includes enabling precharging of a bit line of the memory cell before a next access of the memory cell. The method includes disabling the precharging after a first interval if the next access is a write. The method includes disabling the precharging after a second interval if the next access is a read. The first interval is shorter than the second interval.

19 Claims, 6 Drawing Sheets

(56) References Cited

U.S. PATENT DOCUMENTS

| | | |
|---|---|---|
| 2009/0146689 A1 | 6/2009 | Chandler |
| 2010/0091585 A1 | 4/2010 | Wang |
| 2012/0155151 A1 | 6/2012 | Rachamadugu |
| 2014/0269091 A1 | 9/2014 | Zheng |
| 2015/0098267 A1 | 4/2015 | Jain et al. |
| 2015/0109865 A1* | 4/2015 | Gulati ................... G11C 11/419 |
| | | 365/189.02 |
| 2015/0162056 A1 | 6/2015 | Gupta et al. |
| 2016/0217835 A1 | 7/2016 | Blott et al. |
| 2018/0157488 A1 | 6/2018 | Shu |
| 2018/0240520 A1 | 8/2018 | Best |
| 2019/0139600 A1 | 5/2019 | Wu et al. |
| 2020/0084052 A1 | 3/2020 | O'Connell |
| 2020/0388329 A1 | 12/2020 | Choserot |
| 2021/0124701 A1 | 4/2021 | Lee et al. |
| 2022/0254411 A1* | 8/2022 | Chen ........................ G11C 7/12 |

* cited by examiner

WEAK PRECHARGE BEFORE WRITE DUAL-RAIL SRAM WRITE OPTIMIZATION

BACKGROUND

Description of the Related Art

Figure 1:
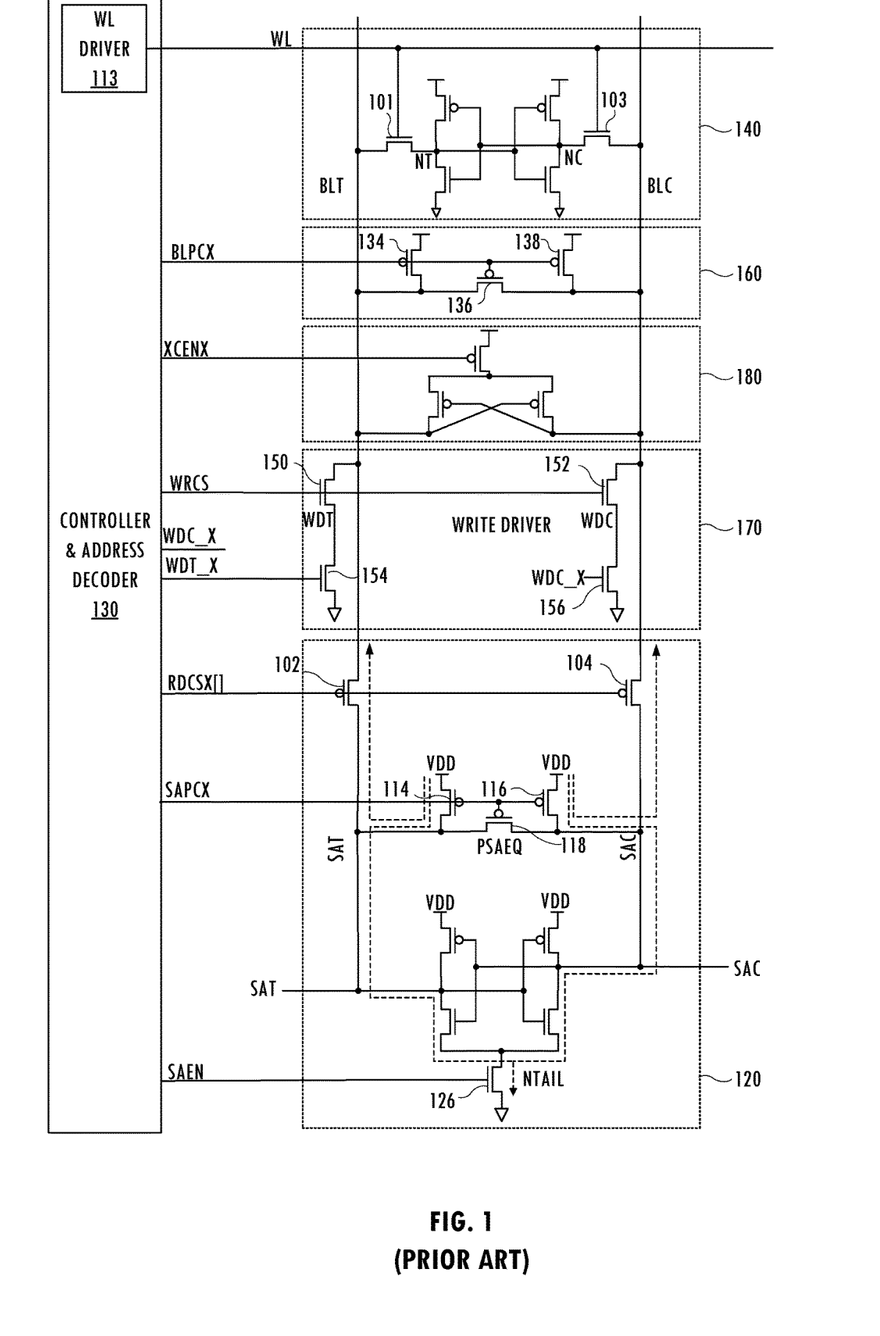
FIG. 1 illustrates a circuit diagram for an exemplary memory cell and associated circuitry.

Referring to FIG. 1, memory cell 140 is an exemplary six transistor, dual-rail static random access memory (SRAM) cell that is coupled to associated circuitry. Memory cell 140 includes pass transistor 101 and pass transistor 103 having gates driven by word line WL. Memory cell 140 further includes two cross coupled inverters coupled to bit line BLT and bit line BLC through the pass transistors. Bit lines BLT and BLC are precharged and have significant capacitance since many memory cells are coupled to the bit lines for density purposes. Word line driver 113 asserts (i.e., sets to an active level) the signal on word line WL for read operations causing charge to be delivered into the memory cell from the bit lines.

Precharge transistors 134 and 138 precharge bit line BLT and bit line BLC to VDD (e.g., a power supply voltage of memory cell 140 or a power supply voltage of controller and address decoder 130) responsive to assertion of the precharge signal BLPCX by controller and address decoder 130 in preparation for a memory cell operation (i.e., a read or a write). Precharge signal BLPCX is active low as indicated by the "X." Equalizer transistor 136 is coupled to BLPCX and shorts together bit line BLT and bit line BLC while precharge signal BLPCX is active.

Sense amplifier circuit 120 includes read column select transistor 102 and read column select transistor 104 that function to select a desired bit line pair to couple to the sense amplifier circuit 120. Read column select transistor 102 couples (or isolates) the bit line true BLT and sense amplifier true line SAT. Read column select transistor 104 couples (or isolates) bit line complement BLC and sense amplifier complement line SAC. The read column select control signal RDCSX is active low as indicated by the "X." Precharge transistor 114 and precharge transistor 116 precharge sense amplifier true line SAT and sense amplifier complement line SAC to VDD responsive to assertion of the active low sense amplifier precharge signal SAPCX in preparation for a read operation. The equalizer transistor 118 is also coupled to sense amplifier precharge signal SAPCX and shorts together sense amplifier true line SAT and sense amplifier complement line SAC while precharge is active. Once the sense amplifier true line SAT and sense amplifier complement line SAC are precharged, and bit lines BLT and BLC are precharged by the separate precharge circuit described above, precharge transistors 114 and 116 and equalizer transistor 118 are turned off, the read column selects are turned on to couple bit lines BLT and BLC to the sense amplifier true line SAT and sense amplifier complement line SAC. A differential charge builds up on sense amplifier true line SAT and sense amplifier complement line SAC corresponding to the value of the memory cell being read. Once that differential charge has built up, differential sense amplifier circuit 120 is turned on using the sense amplifier enable signal SAEN to enable tail transistor 126 to latch the value of the memory cell being read.

Write driver 170 includes pass transistor 150 and pass transistor 152 having gates driven by write column select line WRCS. In an embodiment, write driver 170 includes pull-down transistor 154 and pull-down transistor 156 coupled to bit line BLT and bit line BLC, respectively, via pass transistor 150 and pass transistor 152, respectively. For write operations, controller and address decoder 130 asserts write column select line WRCS to cause the memory cell to be discharged from the bit lines according to write data signal WDT_X and write data signal WDC_X, which are active low, as indicated by the "X."

Figure 2:
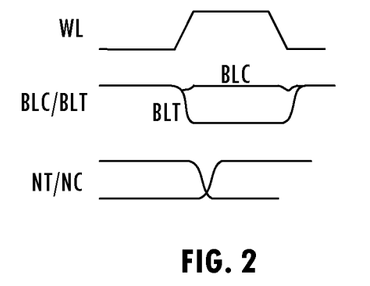
FIG. 2 illustrates exemplary waveforms for a write to the memory cell of FIG. 1.
Figure 3:
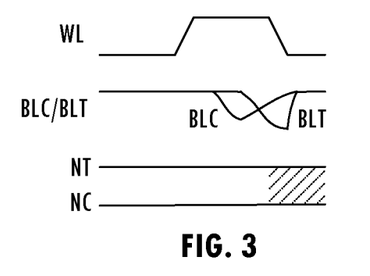
FIG. 3 illustrates exemplary waveforms for a failure of a write to the memory cell of FIG. 1.

Referring to FIGS. 1 and 2, in an exemplary write operation of memory cell 140, bit lines BLT and BLC are precharged to VDD after a first memory operation and prior to a next memory operation. If the next operation is a read, both bit lines need to be fully precharged to VDD before beginning to develop a differential on the bit lines (e.g., a differential of approximately 5 mV-10 mV). If the next access is a write, write driver 170 needs to drive data on bit lines BLT and BLC according to write data WDT_X and WDC_X after precharging the bit lines and before asserting word line WL. Assertion of word line WL causes a high-node to discharge through n-type transistors. The n-type transistors have a strength sufficient to overcome the pull-up of memory cell 140. A weak '1' is written to memory cell 140 via a source-follower n-type transistor transfer device. In at least one embodiment, when the new data arrives (e.g., to drive bit line BLC to VDD) there is no strong path to VDD since the write driver only uses n-type transistors. If write driver 170 does not fully drive the data on bit lines BLT and BLC before or at the same time as asserting word line WL, then memory cell 140 starts a read operation, e.g., drives bit line BLC to ground and bit line BLT stays at VDD, and the write fails, as illustrated in FIG. 3. Accordingly, improved techniques for writing a memory cell are desired.

SUMMARY OF EMBODIMENTS OF THE INVENTION

In at least one embodiment of the invention, a method for accessing a memory cell includes enabling precharging of a bit line of the memory cell before a next access of the memory cell. The method includes disabling the precharging after a first interval if the next access is a write. The method includes disabling the precharging after a second interval if the next access is a read. The first interval is shorter than the second interval.

In at least one embodiment of the invention, a memory includes a memory cell coupled to a bit line and responsive to a bit line precharge control signal, a memory cell select signal, and a memory cell write control signal. The memory includes a control circuit configured to generate the bit line precharge control signal, the memory cell select signal, and the memory cell write control signal to enable precharging of the bit line before a next access of the memory cell, disable the precharging after a first interval if the next access is a write, and disable the precharging after a second interval if the next access is a read. The first interval is shorter than the second interval.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

A technique for reducing or eliminating write failures of a dual-rail SRAM memory cell weakly precharges bit lines of the memory cell to power supply voltage VDD before a write to the memory cell and performs a regular precharge of the bit lines to VDD before a read of the memory cell. In at least one embodiment, a precharge interval begins when a precharge control signal enables precharging of the bit lines of the memory cell and the precharge interval ends when the precharge control signal disables precharging of the bit lines. In at least one embodiment, the duration of the precharge interval prior to a write is different from a duration of a precharge interval prior to a read. In at least one embodiment, weakly precharging uses a precharge interval that is substantially shorter than the precharge interval of a regular precharge. In at least one embodiment, the shorter precharge interval prior to a write provides additional time for a write driver to drive data on the bit lines prior to a word line for a write being asserted. In at least one embodiment, a controller asserts a word line for a write later in a memory operation cycle than it asserts the word line for a read, i.e., the controller delays word line assertion for a write.

Figure 4:
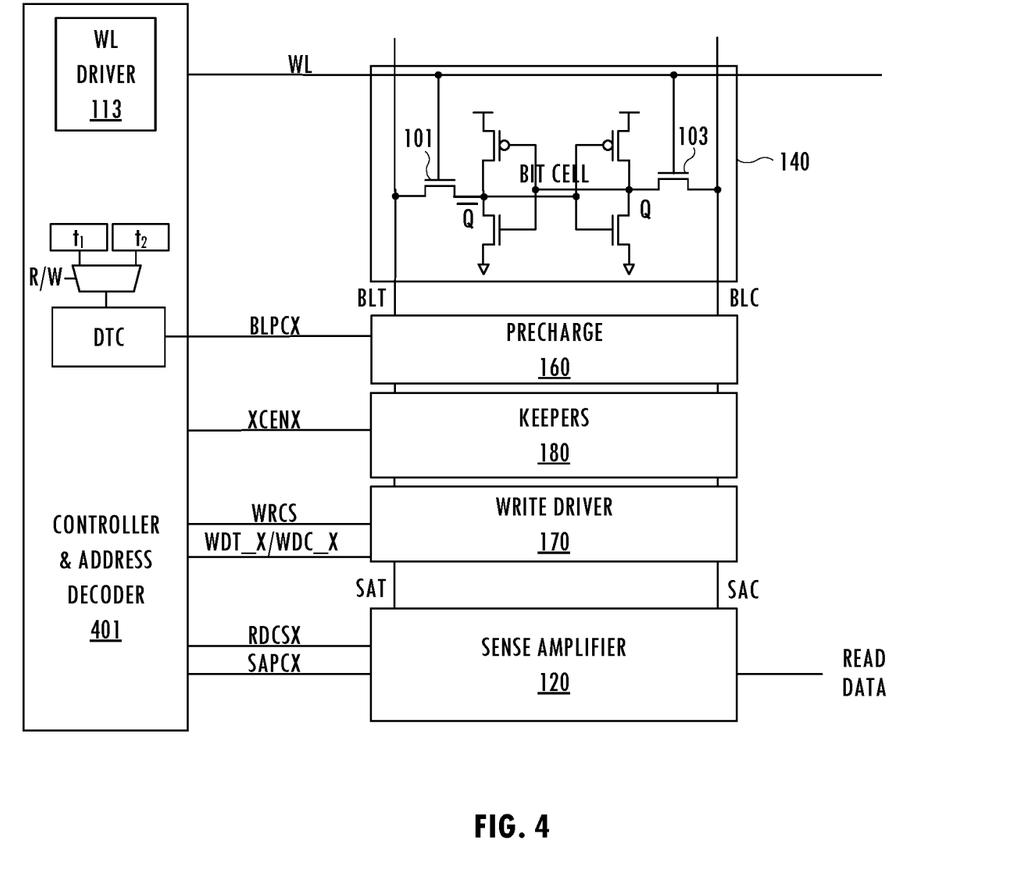
FIG. 4 illustrates a functional block diagram of a memory cell controlled by a controller and address decoder consistent with at least one embodiment of the invention.
Figure 5:
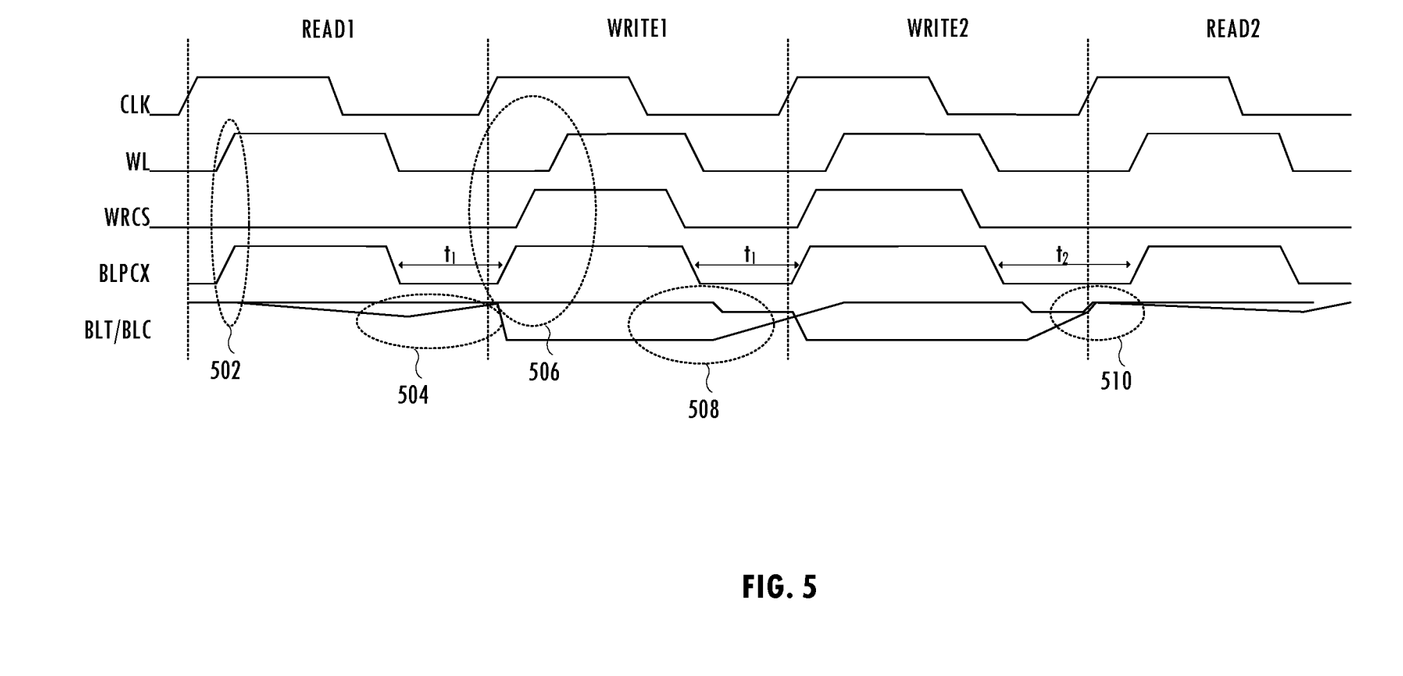
FIG. 5 illustrates exemplary waveforms generated by the controller and address decoder of FIG. 4 consistent with at least one embodiment of the invention.

Referring to FIGS. 4 and 5, controller and address decoder 401 generates memory control signals coordinated with transitions of clock signal CLK. For example, in memory operation READ1, controller and address decoder 401 generates memory control signals for a read of memory cell 140. In waveform section 502, controller and address decoder 401 resets bit line precharge signal BLPCX to an inactive level (e.g., '1') after fully precharging bit lines BLT and BLC to VDD (e.g., 1.4 V) prior to the read, and word line driver 113 selects memory cell 140 by setting word line WL to an active level (e.g., '1'). In at least one embodiment, VDD is the power supply voltage of memory cell 140. In other embodiments, VDD is the power supply voltage of controller and address decoder 130. Controller and address decoder 130 receives a power supply voltage having a first positive voltage range and memory cell 140 receives a second power supply voltage having a second positive voltage range. In at least one embodiment, the first positive voltage range and the second positive voltage range are different, although in other embodiments, the first positive voltage range and the second positive voltage range are the same. The transitions in waveform section 502 occur synchronously after a rising edge of clock signal CLK. In memory operation READ1, memory cell 140 develops a relatively low differential signal on bit lines BLT and BLC, as illustrated in waveform section 504. Sense amplifier 120 detects that relatively low differential signal and generates signal READ DATA accordingly. Controller and address decoder 401 resets word line WL to an inactive level and enables precharging by setting bit line precharge signal BLPCX to an active level (e.g., '0'). In general, a precharge before a write is less stringent than a precharge before a read, thus controller and address decoder 401 ends the precharging early before the write, thereby weakly precharging bit lines BLT and BLC. The precharge after memory operation READ1 and before memory operation WRITE 1 precharges bit lines BLT and BLC using a first interval $t_1$ before controller and address decoder 401 sets up write data on bit lines BLT and BLC by setting write column select line WRCS to an active level (e.g., '1') and resetting bit line precharge signal BLPCX to an inactive level.

In waveform section 506, controller and address decoder 401 generates memory control signals for memory operation WRITE1 to memory cell 140. Controller and address decoder 401 resets bit line precharge signal BLPCX early, i.e., prior to assertion of word line WL, causing the precharge prior to the write to have duration $t_1$. Since the write time is dominated by the time constant of the bit line, driving data onto the bit line earlier improves performance. In response to the end of the precharge, write column select line WRCS activates write driver 170 to drive data on bit lines BLT and BLC earlier than in a conventional memory access, thereby easing challenges (e.g., false reads) described above. For example, write driver 170 drives bit line BLT or bit line BLC all the way to ground while maintaining the other bit line at VDD after the precharge ends and before asserting write line WL.

Waveform section 508 of memory operation WRITE1 illustrates a precharge for a write immediately after a write to memory cell 140. One bit line falls slightly due to an equalizer transistor in precharge circuit 160. The other bit line rises, but since precharge device rolloff makes the last approximately 10% of the precharging (e.g., approximately 100 mV) slower than the rest of the precharging (e.g., the first 90%), with a high $V_{DS}$ and since the bit lines are only weakly precharged (e.g., bit line precharge signal BLPCX is reset early, after interval $t_1$), bit line BLT or bit line BLC may not precharge all the way to VDD before the next write of memory operation WRITE2. However, under some conditions bit line BLT or bit line BLC does precharge all the way to VDD before the next write of memory operation WRITE2.

The weak precharge between memory operation WRITE1 and memory operation WRITE2 over interval $t_1$ ends prior to controller and address decoder 401 setting write column select signal WRCS to an active level that cuts off the precharging. In at least one embodiment, write column select signal WRCS and write data signals WDT_X and WDC_X cause write driver 170 to drive one bit line to ground. In at least one embodiment, cross-coupled keeper transistors 180 slowly return the other bit line to VDD in response to controller and address decoder 401 asserting cross-couple enable signal XCENX. Since the precharge before a write is less stringent than the precharge before a read, controller and address decoder 401 ends the precharging early (e.g., at end of interval $t_1$), the bit lines are weakly precharged, and may only reach a level that is less than VDD (e.g., 90% of VDD). However, under some conditions, the bit lines reach VDD.

A write to memory cell 140 requires data to be set up on bit lines BLT and BLC before assertion of word line signal WL. Rather than asserting word line WL concurrently with resetting bit line precharge signal BLPCX to an inactive level, bit line precharge signal BLPCX is reset early for the write, allowing data to be driven onto the bit lines early to reduce read-before-write challenges in a dual-rail SRAM. Controller and address decoder 401 drives write column select signal WRCS as fast as possible to set up data before assertion of word line WL. Write driver 170 drives data to be written to memory cell 140 on bit lines BLT and BLC before asserting word line WL. In at least one embodiment, assertion of word line WL is delayed for the write to provide additional time to setup data on bit lines BLT and BLC. In at least one embodiment, instead of the circuit illustrated in FIG. 4, write driver 170 includes a push-pull driver that finishes the precharge by pulling up the appropriate bit line the rest of the way to VDD while setting up write data. For example, the memory cell 140 recovers from a memory access associated with a prior clock cycle and data opposing next data of the next write cycle with half a precharge (e.g., 50% VDD).

After resetting write column select signal WRCS to an inactive level in memory operation WRITE2, controller and address decoder 401 resets word line WL and sets bit line precharge signal BLPCX to an active level for interval $t_2$, which is longer than interval $t_1$, and provides sufficient time to equalize the bitlines to VDD before a read. That is, controller and address decoder 401 does not reset bit line precharge signal BLPCX and disable precharging early as it did before a write. In at least one embodiment of controller and address decoder 401, interval $t_1$ is substantially shorter than (e.g., 30%-40% shorter than interval $t_2$). In at least one embodiment CLK has the same frequency (e.g., 5 GHz) as the remainder of the product (e.g., processor). Waveform section 510 illustrates a precharge for memory operation READ2 immediately after memory operation WRITE2. Bit lines BLT and BLC precharge all the way to VDD before the read.

To avoid an unintended read from occurring prior to a write, rather than precharging bit lines BLT and BLC to VDD and asserting the word line at the same time as disabling the precharge of bit lines BLT and BLC, bit lines BLT and BLC are weakly precharged. The bit line precharge is disabled earlier than for a read (e.g., and may not be precharged to VDD, but to at most 90% of VDD), allowing data to be driven on the bit lines early and increasing the time for the data to setup prior to asserting word line WL. The bit line precharge prior to a write operation is disabled prior to the assertion of the word line. As a result, the precharge interval preceding a write is shorter than the precharge interval preceding a read.

In at least one embodiment, controller and address decoder 401 includes a digital-to-time converter (e.g., a counter, a timer, or other suitable circuit) that converts a digital value corresponding to a selected precharge interval to corresponding edges of bit line precharge signal BLPCX. Bit line precharge signal BLPCX has an active level for interval $t_1$ prior to a write instruction and has an active level for interval $t_2$ prior to a read instruction. In at least one embodiment of controller and address decoder 401, interval $t_1$ and interval $t_2$ have predetermined values, which are determined by simulation. In other embodiments of controller and address decoder 401 interval $t_1$ and interval $t_2$ have programmable values that are configured based on values provided to controller and address decoder 401 during initialization of the system or during production test. Controller and address decoder 401 selects an interval value based on whether a next access is a read or the next access is a write and generates bit line precharge signal BLPCX accordingly.

Figure 6:
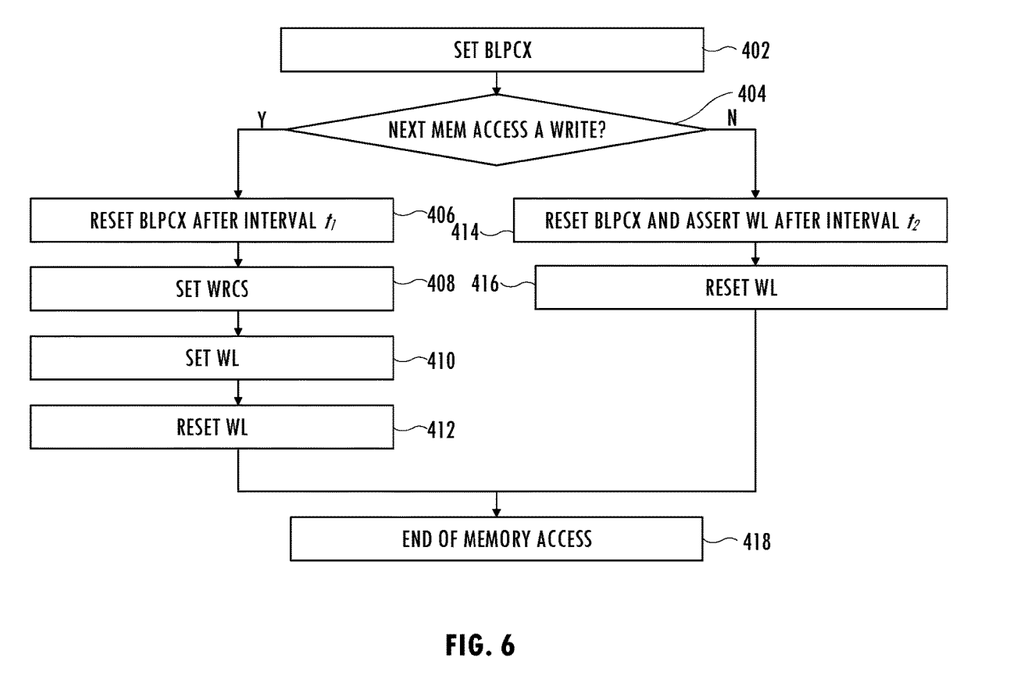
FIG. 6 illustrates exemplary information and control flows for an embodiment of the controller and address decoder of FIG. 4 consistent with at least one embodiment of the invention.

In at least one embodiment, controller and address decoder 401 includes control logic configured to set bit line precharge signal BLPCX to an active level synchronously to resetting word line WL to an inactive level (402). Controller and address decoder 401 determines whether the next access to a memory cell is a write (404). If the next access is a read, then after interval $t_2$ controller and address decoder 401 resets bit line precharge signal BLPCX and sets word line WL to an active level (414). At the end of the read, controller and address decoder 401 resets word line WL to an inactive level (416) and ends the memory access (418). If the next access is a write (404), then controller and address decoder 401 resets bit line precharge signal BLPCX to an inactive level after interval $t_1$ (406), asserts WRCS after resetting bit line precharge signal BLPCX (408), asserts word line WL to activate the write (410), resets word line WL to an inactive level to end the write (412), and ends the memory access (418). Note that the waveforms of FIG. 5 and the control flow of FIG. 6 are exemplary only.

Figure 7:
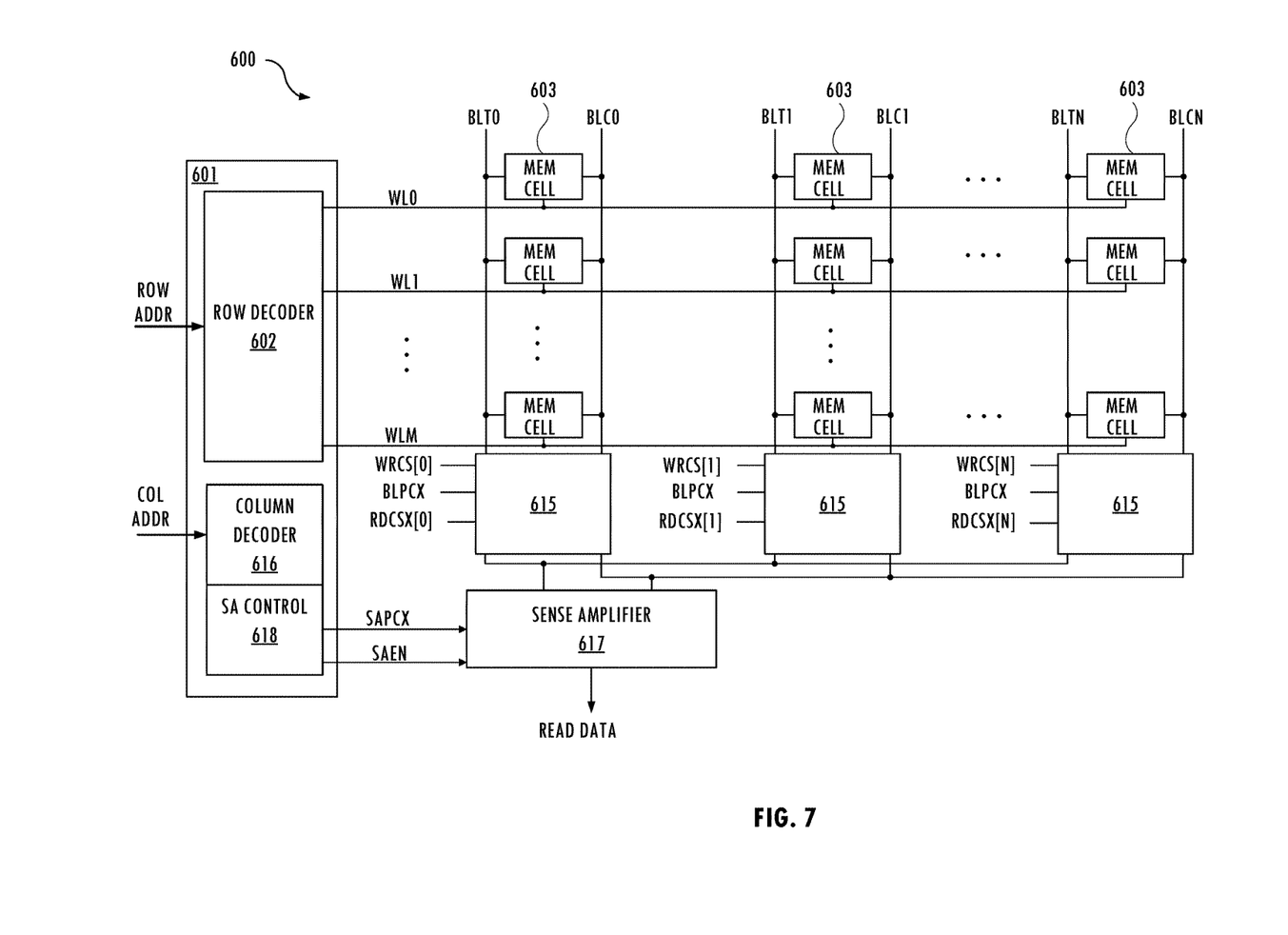
FIG. 7 illustrates a functional block diagram of a memory array consistent with at least one embodiment of the invention.

FIG. 7 illustrates a high level block diagram of a portion of memory bank 600 that places the memory cell, controller and address decoder, and associated circuitry in context. Controller and address decoder 601 includes row decoder 602 coupled to decode a row address and includes word line drivers that drive word lines WL0 through WLM based on the row address. The word lines are coupled to memory cells 603. Write data is driven to memory cells 603 via complementary bit lines (BLT0, BLC0, BLT1, BLC1, and BLTN, BLCN) according to write column select signals WRCS[ ]. Complementary bit lines (BLT0, BLC0, BLT1, BLC1, and BLTN, BLCN) are also coupled to memory cells 603, circuitry 615, and to sense amplifier 617 through read column select transistors (not shown) controlled by RDCSX[ ]. Column decoder 616 receives the column address and selects the appropriate bit line pair to be coupled to sense amplifier 617 using the RDCSX[ ] signals. In an embodiment, sense amplifier 617, which is controlled by SA control 618, is the embodiment shown as sense amplifier circuit 120 or another embodiment. Note that the precharge circuitry, keepers, write driver, associated column select circuitry, and write column select signals, which are also controlled by Controller and address decoder 601 during write operations, are included in associated circuitry 615 for ease of illustration.

Figure 8:
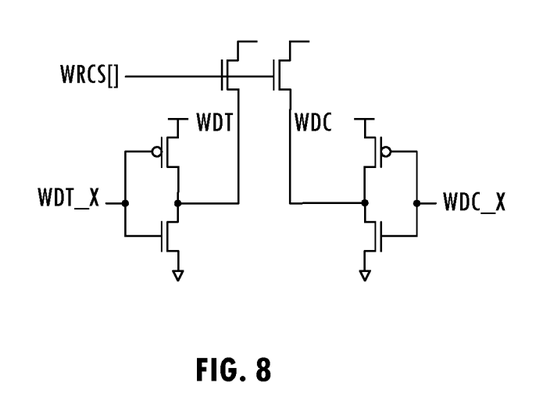
FIG. 8 illustrates a circuit diagram of an alternate write driver for the memory cell of FIG. 4.

Thus, a technique for controlling a memory cell that precharges the bit lines before a read using a regular precharge interval and weakly precharges the bit lines using a shorter interval before a write is disclosed. The description of the invention set forth herein is illustrative and is not intended to limit the scope of the invention as set forth in the following claims. For example, while the invention has been described in an embodiment in which a six-transistor memory cell is used, one of skill in the art will appreciate that the teachings herein can be utilized with memory cells including other numbers of transistors. In addition, while the invention has been described in an embodiment in which a write driver including only n-type transistors is used, one of skill in the art will appreciate that the teachings herein can be utilized with other write drivers including other types of transistors (e.g., the write driver of FIG. 8, which is used in embodiments where the capacitance on node WDT and node WDC is relatively high). The terms "first," "second," "third," and so forth, as used in the claims, unless otherwise clear by context, are to distinguish between different items in the claims and do not otherwise indicate or imply any order in time, location, or quality. For example, "a first memory access," and "a second memory access," do not indicate or imply that the first memory access occurs in time before the second memory access. Variations and modifications of the embodiments disclosed herein may be made based on the description set forth herein, without departing from the scope of the invention as set forth in the following claims.

What is claimed is:

1. A method for accessing a memory cell, the method comprising:
    enabling precharging of a bit line of the memory cell before a next access of the memory cell;
    disabling the precharging after a first interval if the next access is a write; and
    disabling the precharging after a second interval if the next access is a read, the first interval being shorter than the second interval,
    wherein the bit line is precharged to a memory cell power supply voltage in response to the next access being a read or the next access being a write after a read access, and
    wherein the bit line is precharged to a level less than the memory cell power supply voltage prior to a write column select signal cutting off the precharging of the bit line and driving a complementary bit line to ground in response to the next access being a write after a write access.

2. The method as recited in claim 1,
    wherein enabling the precharging comprises setting a bit line precharge control signal of the memory cell to an active level prior to the next access of the memory cell, and
    wherein the next access of the memory cell is a write, the precharging is disabled after the first interval, and the disabling comprises resetting the bit line precharge control signal to an inactive level prior to assertion of a word line control signal.

3. The method as recited in claim 1,
    wherein enabling the precharging comprises setting a bit line precharge control signal of the memory cell to an active level prior to the next access of the memory cell, and
    wherein the next access of the memory cell is a read, the precharging is disabled after the second interval, and the disabling comprises resetting the bit line precharge control signal to an inactive level concurrently with setting of a word line control signal to a second active level.

4. The method as recited in claim 1, wherein the first interval is substantially shorter than the second interval.

5. The method as recited in claim 1, wherein a prior access is a read, the next access is a write, and the bit line is precharged to the memory cell power supply voltage.

6. The method as recited in claim 1,
    wherein a prior access is a write, the next access is a write, and the bit line is precharged to at most 90% of the memory cell power supply voltage.

7. The method as recited in claim 1, wherein a memory cell control circuit receives a power supply voltage having a first positive voltage range and the memory cell power supply voltage has a second positive voltage range.

8. The method as recited in claim 1, wherein the write is synchronous to a clock signal having a same frequency as a second clock signal of a processor accessing a memory array including the memory cell.

9. The method as recited in claim 1, wherein a bit line precharge control signal is asserted concurrently with resetting of a word line control signal to a second inactive level.

10. A memory comprising:
    a memory cell coupled to a bit line and responsive to a bit line precharge control signal, a write column select signal, and a word line control signal; and
    a control circuit configured to generate the bit line precharge control signal, the write column select signal, and the word line control signal to precharge the bit line before a next access of the memory cell, disable the precharging after a first interval if the next access is a write, and disable the precharging after a second interval if the next access is a read, the first interval being shorter than the second interval,
    wherein the bit line is precharged to a memory cell power supply voltage in response to the next access being a read or the next access being a write after a read access, and
    wherein the bit line is precharged to a level less than the memory cell power supply voltage prior to the write column select signal cutting off the precharging of the bit line and driving a complementary bit line to ground in response to the next access being a write after a write access.

11. The memory recited in claim 10,
    wherein the control circuit asserts the bit line precharge control signal of the memory cell prior to the next access of the memory cell, and
    wherein the next access of the memory cell is a write and the control circuit clears the bit line precharge control signal prior to assertion of the word line control signal.

12. The memory recited in claim 10,
    wherein the control circuit asserts the bit line precharge control signal of the memory cell prior to the next access of the memory cell, and
    wherein the next access of the memory cell is a read and the control circuit clears the bit line precharge control signal concurrently with assertion of the word line control signal.

13. The memory recited in claim 10, wherein the first interval is substantially shorter than the second interval.

14. The memory recited in claim 10, wherein a prior access is a read, the next access is a write, and the bit line is precharged to the memory cell power supply voltage.

15. The memory recited in claim 10, wherein a prior access is a write, the next access is a write, and the bit line is weakly precharged to at most 90% of the memory cell power supply voltage.

16. The memory recited in claim 10, wherein the control circuit asserts the word line control signal and concurrently resets the bit line precharge control signal to an inactive level for a read.

17. The memory recited in claim 10, wherein the control circuit asserts the word line control signal after resetting the bit line precharge control signal to an inactive level for a write.

18. The memory recited in claim 10, wherein the control circuit receives a power supply voltage having a first positive voltage range and the memory cell power supply voltage has a second positive voltage range.

19. The memory recited in claim 10, wherein a prior access is a write, the next access is a write, and the bit line is precharged to at most 90% of the memory cell power supply voltage.

* * * * *